(12) United States Patent
Ying et al.

(10) Patent No.: US 8,093,955 B2
(45) Date of Patent: Jan. 10, 2012

(54) APPLYING CHARGE PUMP TO REALIZE FREQUENCY JITTER FOR SWITCHED MODE POWER CONTROLLER

(75) Inventors: Zheng Ying, Shanghai (CN); Huang Zhang Xu, Shanghai (CN)

(73) Assignee: BCD Semiconductor Manufacturing Limited (KY)

( * ) Notice: Subject to any disclaimer, the term of this patent is extended or adjusted under 35 U.S.C. 154(b) by 188 days.

(21) Appl. No.: 12/547,984

(22) Filed: Aug. 26, 2009

(65) Prior Publication Data

US 2010/0246219 A1    Sep. 30, 2010

(30) Foreign Application Priority Data

Mar. 30, 2009  (CN) .......................... 2009 1 0132657

(51) Int. Cl.
*H03K 3/26*  (2006.01)
(52) U.S. Cl. ........................ 331/111; 331/143
(58) Field of Classification Search .................. 331/111, 331/143; 363/74; 327/157
See application file for complete search history.

(56) References Cited

U.S. PATENT DOCUMENTS

| 6,249,876 | B1 | 6/2001 | Balakrishnan et al. |
| 6,642,804 | B2 * | 11/2003 | Chrissostomidis et al. .. 331/143 |

* cited by examiner

*Primary Examiner* — Joseph Chang
(74) *Attorney, Agent, or Firm* — Kilpatrick Townsend & Stockton LLP

(57) ABSTRACT

Method and apparatus for adding jitter to an oscillator for reducing EMI are disclosed An oscillator circuit includes an oscillator configured to generate a first clock having a first frequency and a frequency jitter circuit including a charge pump configured to charge and discharge first and second capacitors repeatedly for obtaining a time-varying voltage having a second frequency. The time-varying voltage is coupled to the oscillator to vary the first frequency within a frequency range. The charge pump includes a first switch for coupling the first capacitor to a voltage source and a second switch for coupling the first capacitor to the second capacitor. A charge transfer between the first and second capacitors is configured to provide the time-varying voltage.

25 Claims, 12 Drawing Sheets

APPLYING CHARGE PUMP TO REALIZE FREQUENCY JITTER FOR SWITCHED MODE POWER CONTROLLER

CROSS-REFERENCES TO RELATED APPLICATIONS

This application claims priority to Chinese Patent Application No. 200910132657.2 filed Mar. 30, 2009, which is commonly owned and incorporated herein by reference.

BACKGROUND OF THE INVENTION

The present invention relates to switching mode power supplies. More particularly, the invention provides methods and apparatuses for reducing electromagnetic interference (EMI) of switching mode power supplies.

Many electronic components require clean DC power sources that may obtained from other DC or AC power sources using switching mode power regulation systems. Generally, transformer may be used to convert a DC power source to the desired DC power. In order to obtain a small size of transformers, the switching frequency has to be high relative to the alternating current (AC) power line. However, the relative high switching frequency can be coupled back to the AC power line and interfere with the operation of other radio frequency operating equipment such as radio or television receivers. Traditionally, EMI filters must be added to the inputs of the DC source to prevent EMI from leaking out of switching mode power supply back to the DC source. The EMI filter conventionally uses inductors and capacitors to form passive band-stop filters having a notch bandwidth matching the EMI frequencies. The analog EMI filter approach not only is cumbersome because it requires numerous trials of different inductors and filters (i.e., on a trial-and-error basis), but also is expensive and requires large system area for mounting the passive components. Furthermore, passive filters consumes additional power.

EMI is a critical issue in the design of a switching mode power supply. With regards to conventional pulse width modulation (PWM) power converters, the energy of the electromagnetic radiation has its maximum value at the fundamental switching frequency, the radiation energy decreases with higher harmonics. The major portion of the electromagnetic radiation energy resides in the fundamental switching frequency and its lower harmonics. In order to reduce EMI, different frequency jittering techniques can be used. For example, switching frequencies may be varied in order to spread out the electromagnetic radiation energy across a relatively large frequency range.

Many publications have proposed the reduction of EMI using frequency jittering techniques. For example, "Frequency jittering control for varying the switching frequency of a power supply" by Balu Balakrishnan, et al., U.S. Pat. No. 6,249,876, Jun. 19, 2001 (hereinafter "the '876 patent") proposed digital and analog frequency jittering circuits. However, the prior art circuits generate undesired ripples at the power supply.

A digital frequency jittering circuit shown in FIG. 1 of the '876 patent uses a seven-bit binary counter that is clocked by a primary oscillator. The counter outputs are provided to a series of frequency jittering current sources whose outputs are added to the primary oscillator to vary its frequency. This approach has many drawbacks. For example, the frequency jitter is discontinuous due to the digital nature of the binary counter. In this example, the output will toggle with every 8-clock periods of the primary oscillator. This non-continuous frequency change causes high magnitude spikes in a power source. Another drawback is the relative large circuitry of the binary counter that consumes a large silicon area; the silicon area can be quite large if the frequency variation needs to be continuous, i.e., more counter stages and therefore more complexity are required.

An analog frequency jittering circuit, shown in FIG. 3 of the '876 patent, uses a primary oscillator whose frequency is controlled by a primary current source. A second analog oscillator produces a low frequency triangular waveform that is used to control a current mirror. A mirrored current is then added to the primary current source to vary the primary oscillator in a narrow range to reduce the EMI noise. The continuous characteristic of the triangular waveform allows the jitter of the switching frequency to vary continuously with time, hence avoiding the discrete changes of the primary oscillator that cause spikes that radiate EMI emission in the power supply. This jitter circuit generates a secondary current in a second oscillator, but still adds the secondary current to the primary current of the oscillator to vary the oscillator frequency.

From the above, it is seen that an improved technique for reducing EMI of switching mode power supplies is desired.

BRIEF SUMMARY OF THE INVENTION

Embodiments of the present invention provide apparatus and method that use a charge pump circuit to generate a low frequency voltage having a triangular waveform. The low frequency voltage varies the frequency of a primary clock signal of a switching mode power supply for reducing EMI emission. The low frequency voltage includes a magnitude that is applied to a comparator configured to limit the range of the frequency variation of the primary clock signal.

According to an embodiment, an oscillator circuit includes an oscillator configured to generate a first clock having a first frequency and a frequency jitter circuit including a charge pump configured to charge and discharge first and second capacitors repeatedly for providing a time-varying voltage having a second frequency. The time-varying voltage is coupled to the oscillator to vary the first frequency within a frequency range. In an embodiment, the second frequency is lower than the first frequency.

In an embodiment of the oscillator circuit, the charge pump further includes a first switch for coupling the first capacitor to a voltage source, a second switch for coupling the first capacitor to the second capacitor, and a non-overlapping clock generator having an input terminal coupled to the first clock and configured to produce a first phase clock and a second phase clock. The first and second phase clocks are non-overlapping signals. In one embodiment, the first phase clock is configured to turn on the first switch to transfer a first charge between the voltage source and the first capacitor, and the second phase clock is configured to turn on the second switch to transfer a second charge between the first capacitor and the second capacitor.

In another embodiment of the oscillator circuit, the second charge is a function of the first frequency and a capacitance of the first capacitor In another embodiment of the oscillator circuit, the frequency jitter circuit further includes a comparator configured to compare the time-varying voltage alternately with a low threshold voltage and with a high threshold voltage for obtaining a second clock having the second frequency.

In another embodiment of the oscillator circuit, a direction of charge transfer between the first and second capacitors is related to an output of the comparator.

In another embodiment of the oscillator circuit, the low threshold voltage and the high threshold voltage determine the magnitude of the time-varying voltage.

In another embodiment of the oscillator circuit, the magnitude of the time-varying voltage determines the frequency range of the first frequency.

In another embodiment of the oscillator circuit, the frequency jitter circuit further includes a clock synchronizer circuit configured to align the transition of the second clock with the first clock and produce a synchronized second clock having a low state and a high state.

In another embodiment of the oscillator circuit, the oscillator also includes a source current, a sink current, a source switch, a sink switch, and a third capacitor. The source current charges the first capacitor through the source switch; and the sink current discharges the first capacitor through the sink switch. A second comparator is configured to produce a switching signal for controlling the source and sink switches.

In another embodiment of the oscillator circuit, the second comparator includes a first input terminal coupled to a first threshold voltage, a second input terminal coupled to the time-varying voltage, a third input terminal coupled to a voltage of the third capacitor, and an output terminal configured to produce the switching signal. The switching signal determines whether the voltage of the third capacitor is compared with the first threshold voltage or with the time-varying voltage.

According to another embodiment of the invention, a switched mode power supply (SMPS) controller includes an input terminal for receiving a feedback signal from a load of a power supply, an output terminal for outputting a control signal for controlling an output of the power supply, and an oscillator circuit having an oscillator and a frequency jitter circuit. The oscillator is configured to generate a first clock having a first frequency. The frequency jitter circuit includes a charge pump configured to charge and discharge first and second capacitors repeatedly for obtaining a time-varying voltage having a second frequency. The time-varying voltage is coupled to the oscillator to vary the first frequency within a frequency range. The controller also has a control logic circuit configured to provide the control signal based on a time-varying signal from the oscillator circuit and the feedback signal.

In another embodiment of the controller, the charge pump in the oscillator circuit includes a first switch for coupling the first capacitor to a voltage source, a second switch for coupling the first capacitor to the second capacitor, and a non-overlapping clock generator having an input terminal coupled to the first clock and configured to produce a first phase clock and a second phase clock, the first and second phase clocks being non-overlapping signals. The first phase clock is configured to turn on the first switch to transfer a first charge between the voltage source and the switched capacitor, and the second phase clock is configured to turn on the second switch to transfer a second charge between the first capacitor and the second capacitor.

In another embodiment of the controller, the frequency jitter circuit further includes a comparator configured to compare the time-varying voltage alternately with a low threshold voltage and with a high threshold voltage for obtaining a second clock having the second frequency.

In another embodiment of the controller, a direction of charge transfer between the first and second capacitors is related to an output of the comparator.

In another embodiment of the controller, the voltage source includes a high reference voltage coupled to the first switch via a first voltage source switch, and a low reference voltage coupled to the first switch via a second voltage source switch. The first and second voltage source switches are turned on and off with a synchronized low frequency clock.

In another embodiment of the controller, the oscillator also includes a source current, a sink current, a source switch, a sink switch, and a third capacitor. The source current charges the first capacitor through the source switch; and the sink current discharges the first capacitor through the sink switch. A second comparator is configured to produce a switching signal for controlling the source and sink switches.

In another embodiment of the controller, the SMPS controller is a pulse width modulated (PWM) controller.

According to another embodiment, the present invention provides power supply having a transformer with a primary winding coupled to a rectified dc voltage and a secondary winding for providing a regulated output, and a switched mode power supply (SMPS) controller. The SMPS controller includes an input terminal for receiving a feedback signal from a load of a power supply, an output terminal for outputting a control signal for controlling an output of the power supply, and an oscillator circuit having an oscillator and a frequency jitter circuit. The oscillator is configured to generate a first clock having a first frequency. The frequency jitter circuit includes a charge pump configured to charge and discharge first and second capacitors repeatedly for obtaining a time-varying voltage having a second frequency. The time-varying voltage is coupled to the oscillator to vary the first frequency within a frequency range. The controller also has a control logic circuit configured to provide the control signal based on a time-varying signal from the oscillator circuit and the feedback signal.

In an embodiment of the power supply, the charge pump further includes a first switch for coupling the first capacitor to a voltage source, a second switch for coupling the first capacitor to the second capacitor, and a non-overlapping clock generator having an input terminal coupled to the first clock and configured to produce a first phase clock and a second phase clock, the first phase and second phase clocks being non-overlapping signals. The first phase clock is configured to turn on the first switch to transfer a first charge between the voltage source and the first capacitor, and the second phase clock is configured to turn on the second switch to transfer a second charge between the first capacitor and the second capacitor.

In another embodiment of the power supply, the oscillator further includes a comparator having a first input terminal coupled to a first threshold voltage, a second input terminal coupled to the time-varying voltage, a third input terminal coupled to a voltage of the third capacitor, and an output terminal configured to produce the switching signal. The switching signal determines whether the voltage of the third capacitor is compared with the first threshold voltage or with the time-varying voltage.

In another embodiment of the power supply the controller is a pulse width modulated (PWM) controller.

According to yet another embodiment, the present invention provides a method of generating a clock signal having a first frequency varying within a frequency range. The method includes providing an oscillator circuit including a first comparator configured to produce the clock signal having the first frequency, providing a frequency jitter circuit including a charge pump configured to charge and discharge first and second capacitors for producing a time-varying voltage, and applying the time-varying voltage to the first comparator to vary the first frequency within the frequency range.

In an embodiment of the above method, the charge pump further includes a first switch for coupling the first capacitor to a voltage source, a second switch for coupling the first capacitor to the second capacitor, and a non-overlapping clock generator having an input terminal coupled to the first clock and configured to produce a first phase clock and a second phase clock, the first and second phase clocks being non-overlapping signals. The first phase clock is configured to turn on the first switch to transfer a first charge between the voltage source and the switched capacitor, and the second phase clock is configured to turn on the second switch to transfer a second charge between the first capacitor and the second capacitor.

In another embodiment of the method, the frequency jitter circuit further includes a second comparator configured to compare the time-varying voltage alternately with a low threshold voltage and with a high threshold voltage for obtaining a second clock having the second frequency. A direction of charge transfer between the first and second capacitors is related to an output of the second comparator.

Various features and advantages of the present invention will become apparent with reference to the following detailed description and accompanying drawings.

DETAILED DESCRIPTION OF THE INVENTION

Figure 1:
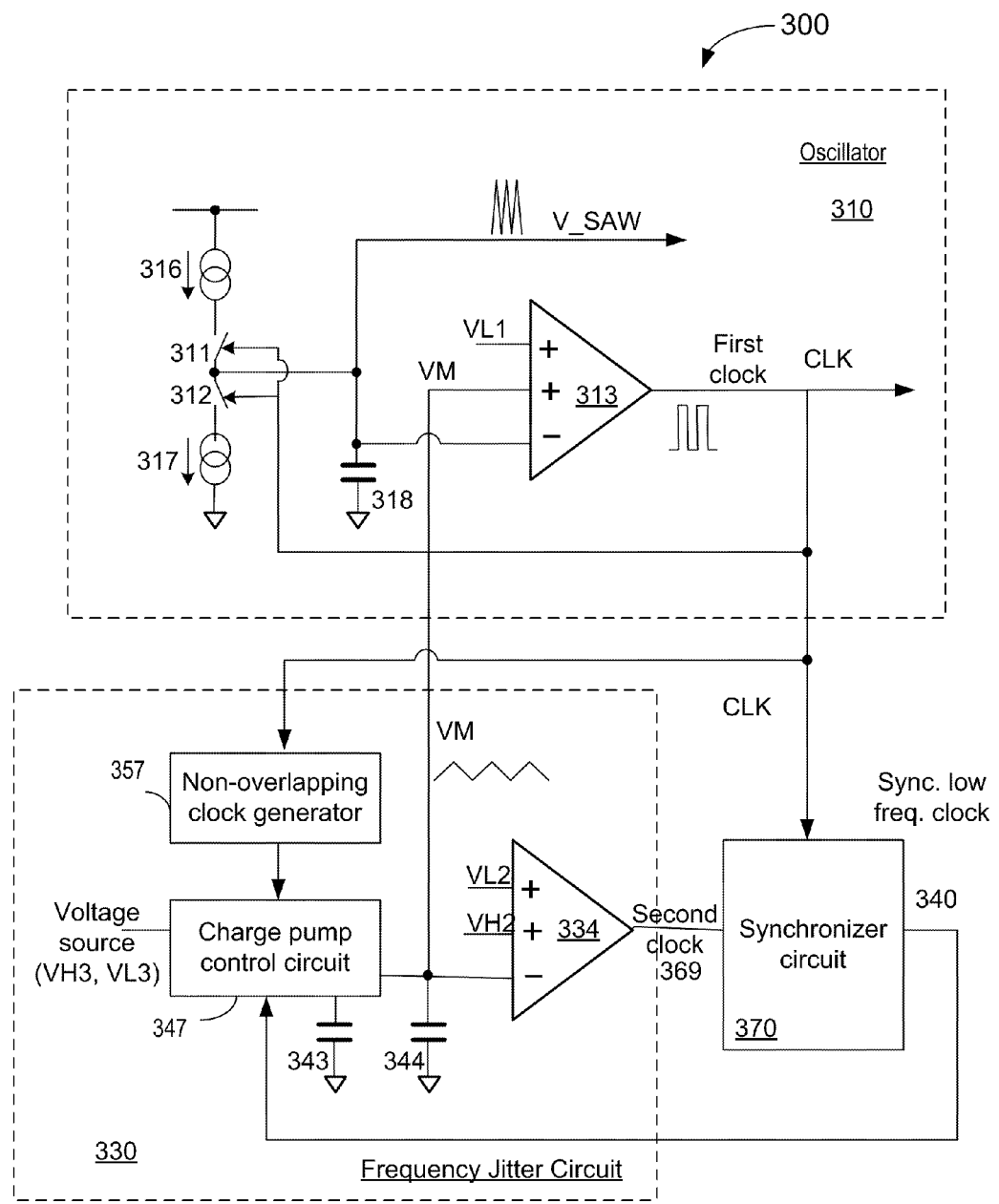
FIG. 1 is a block diagram of an oscillator circuit having a voltage-controlled frequency jitter in accordance with one embodiment of the present invention.

FIG. 1 is a block diagram of an oscillator circuit 300 according to one embodiment of the present invention. This diagram is merely an example, which should not unduly limit the scope of the claims herein. Oscillator circuit 300 includes an oscillator 310, a frequency jitter circuit 330 that provides a time-varying voltage VM to oscillator 310, and a synchronizer circuit 370. Oscillator 310 includes a first comparator 313 having a first positive input terminal coupled to a voltage VL1, a second positive input terminal coupled to voltage VM provided by frequency jitter circuit 330, a negative input terminal coupled to a capacitor 318, and an output terminal which provides a first clock signal CLK. Capacitor 318 is charged by a source current 316 and discharged by a sink current 317 through a respective source switch 311 and sink switch 312 in step with first clock CLK. Capacitor 318 thus generates a voltage V_SAW swinging in step with first clock CLK. Thus, a change in first clock CLK will affect the waveform of voltage V_SAW.

Frequency jitter circuit 330 includes a charge pump control circuit 347 connecting a voltage source (providing voltages VH3 and VL3) to a capacitor 343. Charge pump control circuit 347 pumps a charge from capacitor 343 to a capacitor 344 by means of one or more charge transfer switches (not shown in FIG. 1). The charge transfer operates under the control of a non-overlapping clock generator 357 that receives first clock CLK from oscillator 310. In one embodiment, the voltage source includes a high reference voltage VH3 and a low reference voltage VL3.

Frequency jitter circuit 330 further includes a second comparator 334, which generates a second clock 369 having a frequency significantly lower than that of first clock CLK. In one embodiment, a synchronizer circuit 370 synchronizes second clock 369 with first clock CLK to generate a synchronized low frequency clock 340. Synchronized low frequency clock 340 may alternately connect the high reference voltage VH3 and the low voltage reference VL3 with capacitor 343. In one phase of the synchronized low frequency clock 340, the charge pump circuit pumps up capacitor 344 towards high voltage reference VH3, and in other phase of the synchronized low frequency clock 340, the charge pump circuit pumps down capacitor 344 towards low reference voltage VL3. Thus, the process of pumping up and down generates a time-varying voltage VM at capacitor 344. Second comparator 334 compares alternately the time-varying voltage VM with a high threshold voltage VH2 and a low threshold voltage VL2 to produce second clock 369. Selectable threshold voltages VH2 and VL2 further limit the magnitude of time-varying voltage VM.

Figure 2:
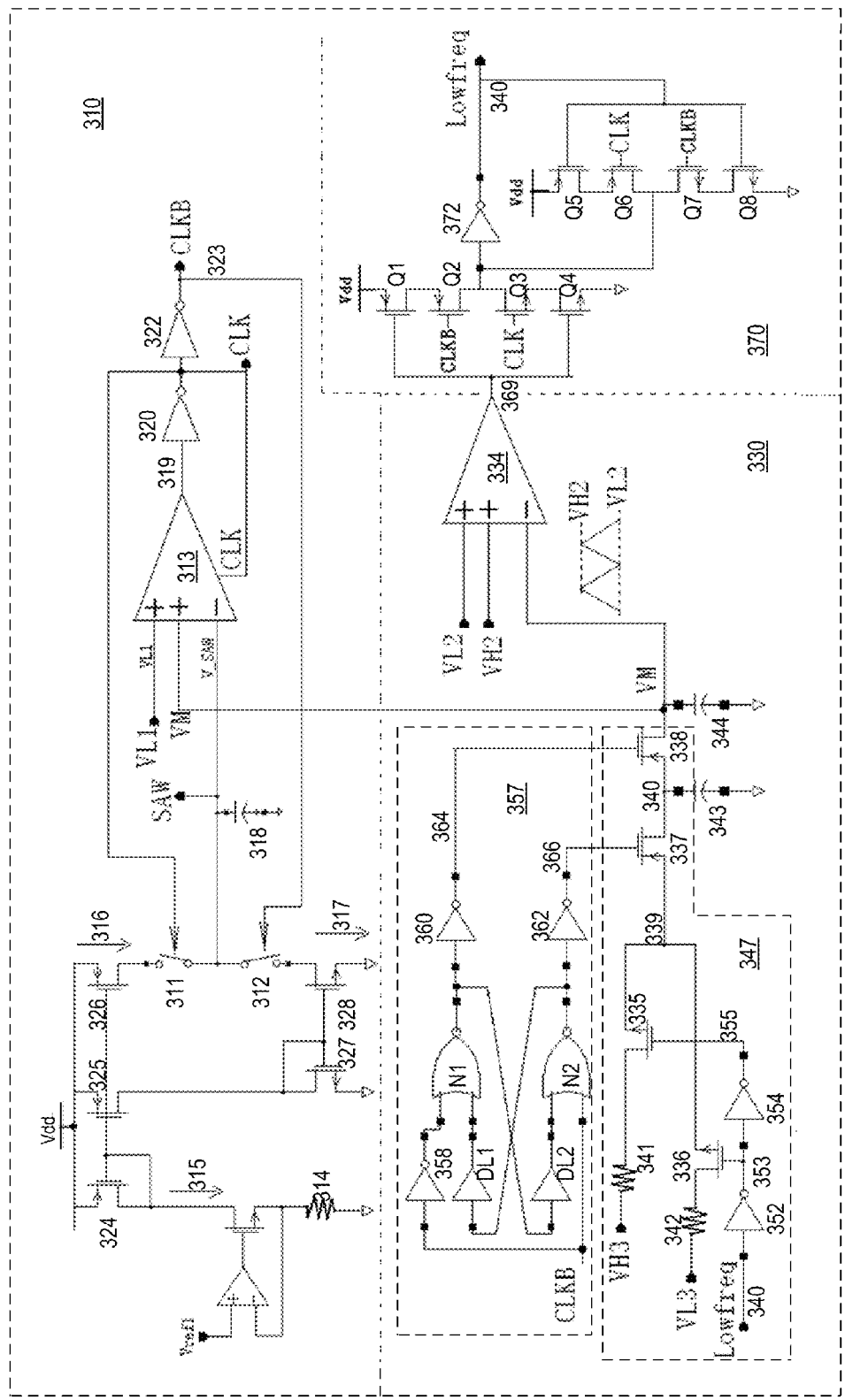
FIG. 2 is a schematic diagram of the oscillator circuit in FIG. 1 in accordance with one embodiment of the present invention.

FIG. 2 is a schematic diagram showing additional details of the oscillator circuit 300 of FIG. 1 according to an embodiment of the present invention, and corresponding components are identified with the same reference numerals. The schematic diagram is merely an example, which should not unduly limit the scope of the claims herein. One of ordinary skill in the art would recognize other variations, modifications, and alternatives. As in FIG. 1, oscillator circuit 300 includes an oscillator 310, a frequency jitter circuit 330, and a synchronizer circuit 370.

As also shown in FIG. 2, oscillator 310 includes comparator 313 that has the first positive input terminal connected to a low threshold voltage VL1, a second positive input terminal connected to capacitor 344 having a voltage VM, and a negative input terminal connected to a capacitor 318 having voltage V_SAW. An output of comparator 313 is connected to an inverting buffer 320 to generate clock CLK having a low state and a high state. Clock CLK is further connected to an inverting buffer 322 to generate an inverting clock CLKB. Depending on its state, clock CLK selects either low threshold voltage VL1 or voltage VM to compare with voltage V_SAW. The detailed structure of comparator 313 will be described below.

Oscillator 310 further includes a reference current 315 which is mirrored by current mirror transistors 324, 325, and 326 to produce a source current 316. Additionally, current mirror transistors 327 and 328 produce a sink current 317. In one embodiment, reference current 315 is determined by a resistor 314 according to the expression (Vref1/R314). Source current 316 charges capacitor 318 via a source current switch 311, and sink current 317 discharges capacitor 318 via a sink current switch 312. Source and sink current switches 311 and 312 are controlled by respective clocks CLK and CLKB.

Operation of comparator 313 will now be explained. When voltage V_SAW is below voltage VM, clock CLK is at logic low and causes switch 311 to turn on and switch 312 to turn off. As a result, source current 316 charges capacitor 318 and causes voltage V_SAW to increase. When voltage V_SAW exceeds voltage VM, output 319 of comparator 313 toggles. Now comparator 313 connects voltage VL1 to its effective positive input and compares it with voltage V_SAW. When voltage V_SAW becomes higher than voltage VL1, CLK changes to logic high, which turns off switch 311 and turns on switch 312. Capacitor 318 now discharges via sink current 317 and causes voltage V_SAW to decrease. When voltage V_SAW decreases below voltage VL1, output 319 of comparator 313 toggles again.

Comparator 313 connects voltage VM to its effective input and compares it with voltage V_SAW. When V_SAW exceeds voltage VM, CLK changes to logic high, which turns off switch 311 and turns on switch 312. As a result, source sink current 317 discharges capacitor 318, and the process repeats. In other words, output 319 of comparator 313 controls the switching between the charging and discharging of capacitor 318. Output 319 also controls the comparing process of comparator 313. Depending on the logic state of output 319, comparator 313 performs the first comparison of voltage VL1 with voltage VM or the second comparison of voltage VM with voltage V_SAW. In this embodiment, voltage VL1 is held at a constant voltage level to ensure a constant low amplitude of voltage V_SAW, and voltage VM limits the upper amplitude of voltage V_SAW.

In one embodiment, source and sink currents 316, and capacitor 318 are held at a constant level. If voltage VM is also held at constant level, then clock CLK has a constant frequency. In one embodiment of the present invention, CLK has a frequency of about 64 kHz. In one embodiment, voltage VM is time varying, i.e., its magnitude changes over time. The change of voltage VM affects the output of comparator 313, i.e., the magnitude of voltage VM determines the frequency of CLK, and the period of voltage VM determines the period of the frequency variation of CLK.

In the embodiment of FIG. 2, voltage VM is provided by frequency jitter circuit 330 that includes charge pump control circuit 347. Charge pump control circuit 347 includes a first transfer switch 337 coupled to a switched capacitor 343. Switched capacitor 343 is further coupled to a reservoir capacitor 344. Switched capacitor 343 is further coupled to high reference voltage VH3 via a source switch 335 and a low reference voltage VL3 via a sink switch 336. In one embodiment, high and low reference voltages VH3 and VL3 are provided by voltage sources. Source and sink switches 335 and 336 are turned on and off with respective control signals 355 and 353 having a frequency significantly lower than the clock signals CLK and CLKB. The low frequency control signal 353 and 355 will be described below.

Charge transfer switches 337 and 338 work in alternation to transfer a charge between capacitors 343 and 344. Switches 337 and 338 are controlled by two non-overlapping control signals 364 and 366, respectively. During step 1, when switch 337 is closed and switch 338 is open, switched capacitor 343 is connected to high reference voltage VH3 across source switch 335. During step 2, transfer switch 337 is open and transfer switch 338 is close, the charge transmitted is ΔQ=C343*(VH3−VM) producing a current that depends on the switching frequency (i.e., CLK) according to the equation I=$f_{CLK}$*ΔQ=$f_{CLK}$*C343*(VH3−VM). In other words, reservoir capacitor 344 increases its voltage VM per cycle according to the charge being pumped from switched capacitor 343.

The charge transfer through the charge transfer switches behaves in a way similar to a resistor (with an equivalent Req=1/($f_{CLK}$*C343)). In one embodiment, switches 337 and 338 have the same on-time period. If steps 1 and 2 are repeated a sufficient number of cycles, voltage VM across capacitor 344 approaches reference voltage VH3. In a similar manner, capacitor 344 can decrease its charge towards reference voltage VL3 by periodically closing and opening switches 337 and 338. Switches 337 and 338 are driven in opposition and their on-time duration do not overlap, i.e., one switch is opened before the other is closed.

The cycle frequency of switches 337 and 338 and the value of switched capacitor 343 determine the charge and discharge time of reservoir capacitor 344. Since the frequency of clock CLK is relatively high, the capacitance and size of capacitors 343 and 344 can be relatively small. In one embodiment, the switches are MOS transistors having precise on/off characteristics to direct charge flow during pumping. In a specific embodiment of the present invention, capacitor 344 has a charge and discharge time of about 1 ms each to produce voltage VM, which varies with a time period of about 2 ms.

FIG. 2 also shows an exemplary circuit of a non-overlapping clock generator 357 as having a cross-coupled NOR gates N1 and N2 forming an RS-latch. Additionally, the non-overlapping clock generator includes delay elements DL1 and DL2. Each delay element is interposed between the output of one NOR gate and the input of the other NOR gate to obtain non-overlapping outputs at inverters 360 and 362. As noted, the non-overlapping clock generator is merely an example, other modifications and alternatives are known by one of skill in the art. For example, the RS-latch functionality formed by the cross-coupled NOR gates with CLKB being the SET input and the output of inverter 358 being the RESET input can also use CLK directly as a RESET input to eliminate inverter 358. One skill in the art can also appreciate that the RS-latch functionality can for example be implemented using cross-coupled NAND gates.

Figure 3A:
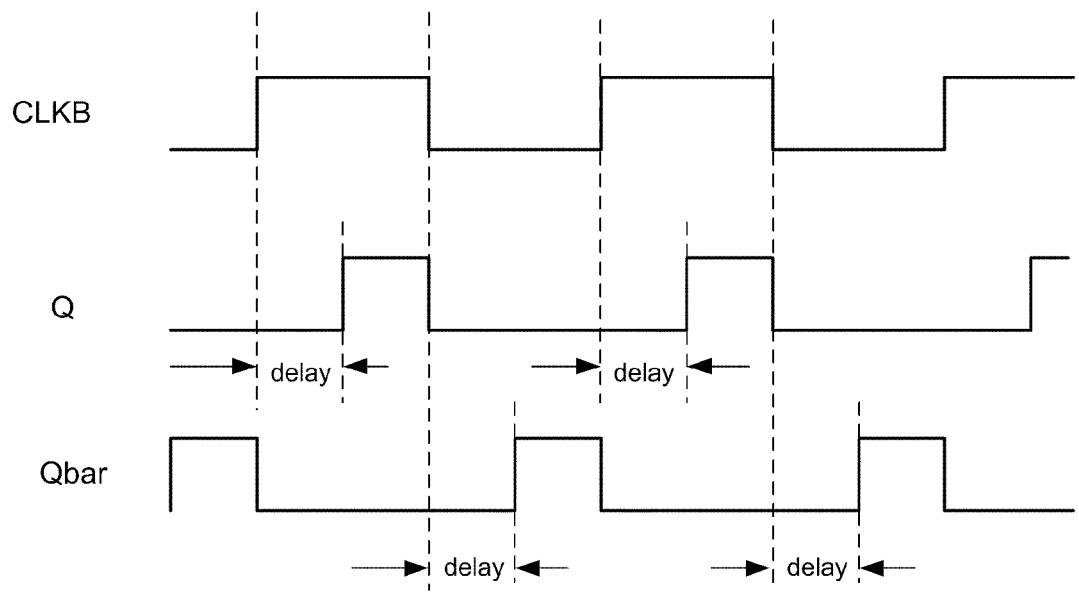
FIG. 3A is a timing diagram of the non-overlapping control signal in accordance with one embodiment of the present invention.

FIG. 3A shows the timing diagram of the cross-coupled NOR gates with delay elements DL1 and DL2 in non-overlapping clock generator 357. CLKB is the SET input of the RS-latch. Without the delay elements, the pulse width of Q and Qbar outputs of the RS-latch would be the same as the CLKB pulse width. The output pulse width is reduced proportionally with the delay time of delay elements DL1 and DL2.

The frequency jitter circuit 330 of FIG. 2 further includes a range comparator 334 that has a first positive input terminal connected to a low threshold voltage VL2 (VL2>VL3), a second positive input terminal connected to a high threshold voltage VH2 (VH2<VH3), a negative input terminal connected to voltage VM of reservoir capacitor 344. Output 369 of comparator 334 has a logic low state and a logic high state. Depending on the state of output 369, comparator 334 either compares voltage VL2 or voltage VH2 (VL2<VH2) with voltage VM. Note that voltage VM ramps up or down with a relatively slow rate over time. In one embodiment of the present invention, the period of VM is about 2 ms (500 Hz). Accordingly, output 369 of comparator 334 provides a low frequency clock 369 that toggles at about 500 Hz.

Low frequency clock 369 is applied to a synchronizer circuit 370, which also receives clocks CLK and CLKB to generate a synchronized low frequency control signal Lowfreq. Lowfreq changes its logic states synchronously with clock CLK. This will ensure that reference voltage VH3 or VL3 will only be applied to node 339 when charge transfer switch 337 is open.

Synchronizer circuit 370 includes a first group of switches comprising of Q1, Q2, Q3, and Q4 and a second group of switches comprising of Q5, Q6, A7, and Q8. The switches of each group are connected in series between a power supply source Vdd and a ground potential. In one embodiment, power supply Vdd is +5V, and ground potential is 0V. In the first group, switches Q1 and Q4 are controlled with output 369 of comparator 334 whereas switches Q3 and Q4 are controlled with the respective clock signals CLKB and CLK. The junction of switches Q2 and Q3 is connected to an inverter 372 configured to produce a synchronized clock Lowfreq. In the second group, switches Q5 and Q8 are controlled by the output of inverter Lowfreq and switches Q6 and Q7 are controlled with the respective clock signals CLK and CLKB. In one embodiment of the present invention, switches Q1, Q2, Q5, and Q6 are p-channel MOS transistors, and switches Q3, Q4, Q7, and Q8 are n-channel MOS transistors. As noted, the synchronizer circuit is merely an example, other modifications and alternatives are known by one of skill in the art. For example, the synchronizer functionality can also be implemented using a D-flipflop having the data input coupled to the signal 369 and the clock input coupled to clock CLK.

In frequency jitter circuit 330, Lowfreq is further connected to an inverter 352 which generates switching signal 353. Switching signal 353 is connected to an inverter 354 to produce switching signal 355. Switching signals 353 and 355 close and open respective switches 336 and 335 to couple either high reference voltage VH3 or low voltage reference VL3 to node 339. In one embodiment of the present invention, a resistor 341 may be inserted between reference voltage VH3 and source switch 355. Similarly, a resistor 342 may be inserted between reference voltage VL3 and sink switch 356.

Figure 3B:
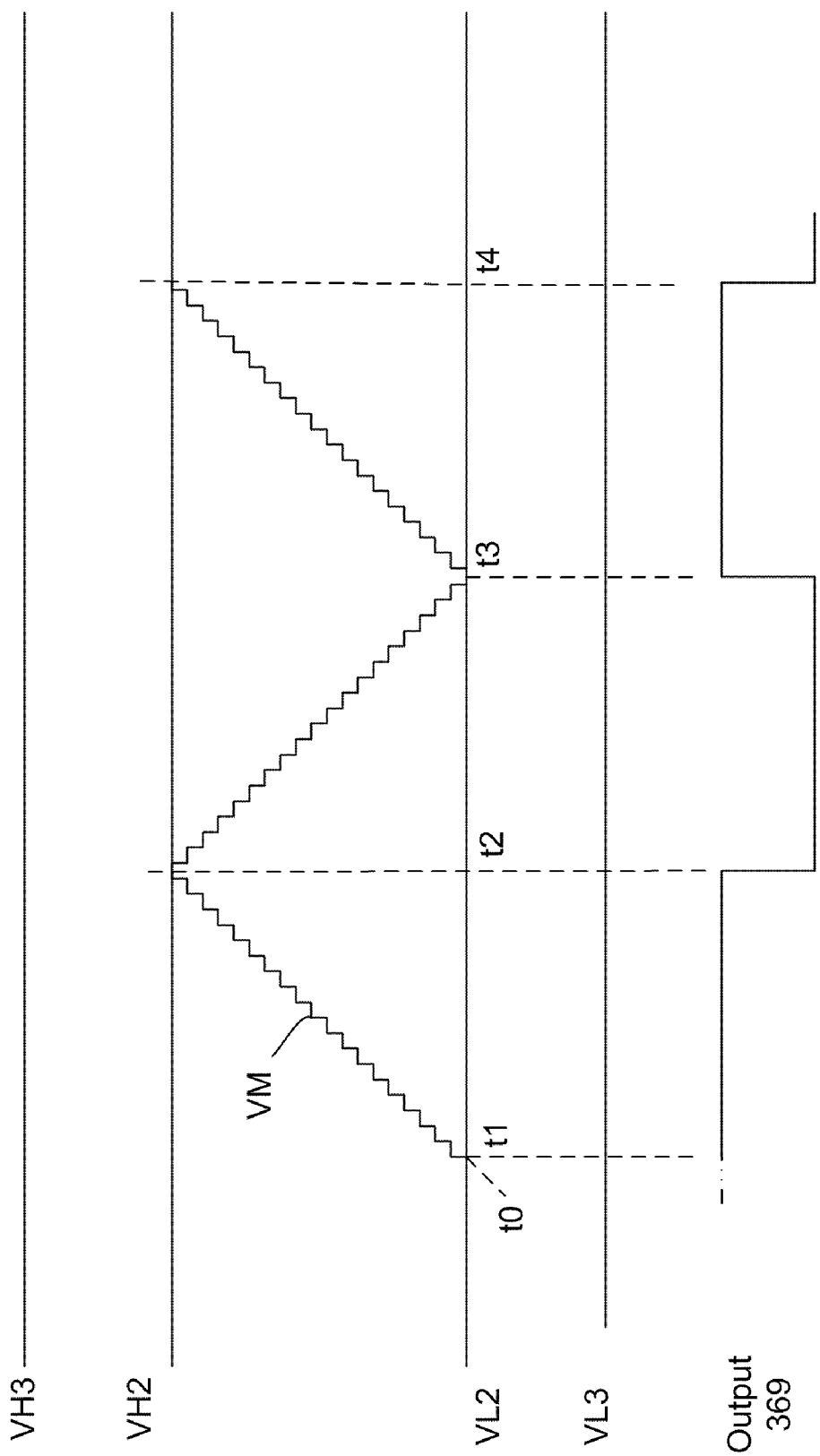
FIG. 3B is a timing diagram of the comparator operation in accordance with one embodiment of the present invention.

FIG. 3B shows the timing diagram of the operation of comparator 334. At start up t0, comparator 334 compares voltage VM with voltage VL2 that is coupled to its effective positive input. As voltage VM is lower than voltage VL2, output 369 of comparator 334 is at logic high, and Lowfreq is at logic high. Switch 335 is turned on and connects reference voltage VH3 to node 339. Capacitor 344 increases its voltage progressively with each cycle of non-overlapping signals 364 and 366. At time t1, voltage VM exceeds VL2, but it is still lower than voltage VH2, and output 369 of comparator remains logic high. Threshold voltage VH2 is still applied as the effective positive input for comparator 334. The charge pump continues pumping up reservoir capacitor 344 and increases voltage VM towards reference voltage VH3. At time t2, voltage VM reaches voltage VH2, output 369 changes now to logic low. Comparator 334 compares voltage VM with threshold voltage VL2 that is now the effective positive input. Voltage source VL3 is now connected to node 339 and reservoir capacitor 344 is now discharging towards VL3. Once voltage VM reaches voltage VL2 at time t3, output 369 of comparator 334 toggles again. Reference voltage VH3 is coupled anew to node 339, which is coupled to switched capacitor 343. Capacitor 344 increases its voltage with each cycle of switch 338 according to the charge being pumped from switched capacitor 343. And the process repeats.

Figure 4:
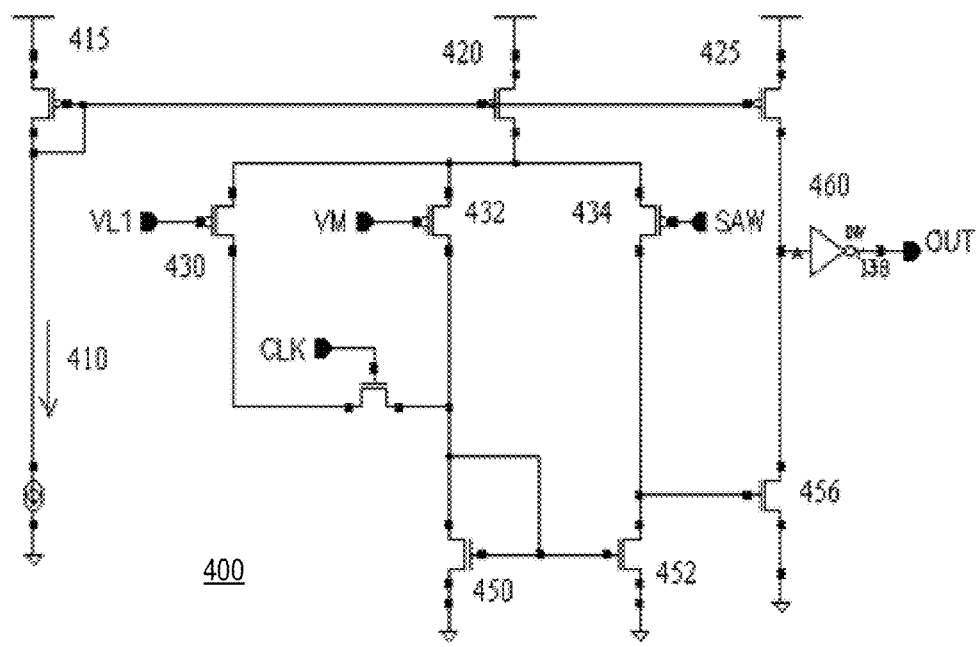
FIG. 4 is a circuit schematic diagram of the first comparator in accordance with one embodiment of the present invention.

FIG. 4 is a simplified circuit diagram of comparator 400 that could be used as comparator 313 in FIGS. 1 and 2, according to an embodiment of the invention. A current source 410 is mirrored by mirror current sources 415, 420 and a drive current source 425. Comparator 400 includes transistors 430, 432, and 434 that each provides a high input impedance to a respective input signal. Comparator 400 is operative to provide an output signal OUT based on the input voltage difference at either transistor pair (430, 434) or (432, 434). In one embodiment, voltage VL1 is coupled to transistor 430, voltage VM is coupled to transistor 432, and voltage V_SAW (at capacitor 318 in FIG. 2) is coupled to transistor 434. The logic state of CLK determines which voltage (VM or VL1) will be compared with voltage SAW. In one embodiment, CLK is the inverted signal OUT at the output of the inverter 320 in FIG. 3B. Comparator 400 also includes an n-channel mirror load 450-452 and the mirror current source 420. Comparator 400 further includes a drive stage having an n-channel transistor 456 and the drive current source 425. The output of the drive stage can further be buffered with an inverter 460.

Figure 5:
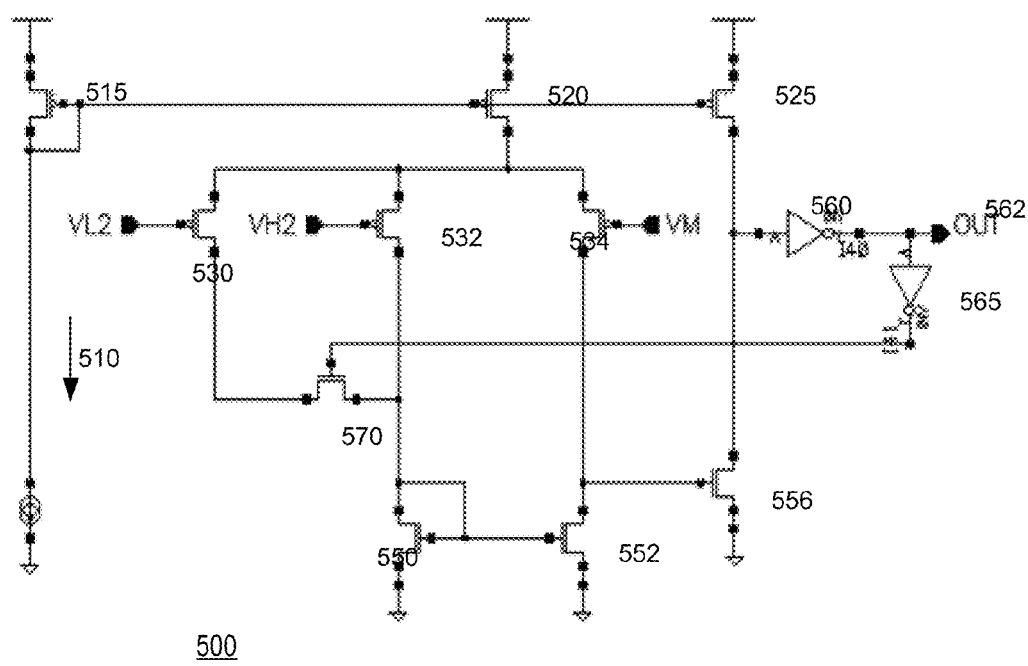
FIG. 5 is a circuit schematic diagram of the second comparator in accordance with one embodiment of the present invention.

FIG. 5 is a simplified circuit diagram of comparator 500 that could be used as comparator 334 in FIGS. 1 and 2, according to an embodiment of the invention. A reference current source 510 is mirrored by mirror current sources 515, 520 and a drive current source 525. Comparator 500 includes transistors 530, 532, and 534 that provide high input impedance to respective input signals. In one embodiment, voltage VL2 is coupled to transistor 530, voltage VH2 is coupled to transistor 532 and voltage VM is coupled to transistor 534. A transistor 570 is used to select either transistors 530 and 534 or transistors 532 and 534 to form a differential input stage. In other words, comparator 500 includes a first comparing process and a second comparing process. The selection of the first or second comparing process is determined by the output state of comparator 500 through feedback connection between output terminal 562 and transistor 570. As depicted in FIG. 2 and described above, comparator 334 in conjunction with the charge pump circuit can produce a periodic signal. The differential input stage also includes an n-channel mirror load 550-552 and the mirror current source 520. Comparator 500 further includes a drive stage having a common-source n-channel transistor 556 and the drive current source 525.

It is noted that the functionality of comparators 313 and 334 described above and shown in FIGS. 4 and 5 can also be implemented using a more complex circuitry. For example, comparators 313 or 334 can be implemented using two individual comparators, a first and second comparators having respective outputs coupled to an RS-flip-flop. For the implementation of comparator 313, the first comparator compares voltage V-SAW with voltage VL1 and produces a first comparison result. The second comparator compares voltage V-SAW with voltage VM and produces a second comparison result. The first and second results are coupled to respective SET and RESET input terminals of the RS-Flip-flop, whose output is equivalent to the output of comparator 313. Similarly, an implementation of comparator 334 may use two individual comparators with a first comparator comparing voltage VM with low threshold voltage VL2 and a second comparator comparing voltage VM with high threshold voltage VH2, and the outputs of the first and second comparators are coupled to respective SET and RESET input terminals of an RS flip-flop, whose output is equivalent to output 369 of comparator 334. One skilled in the art can recognize other variations, modifications or alternatives.

Figure 6:
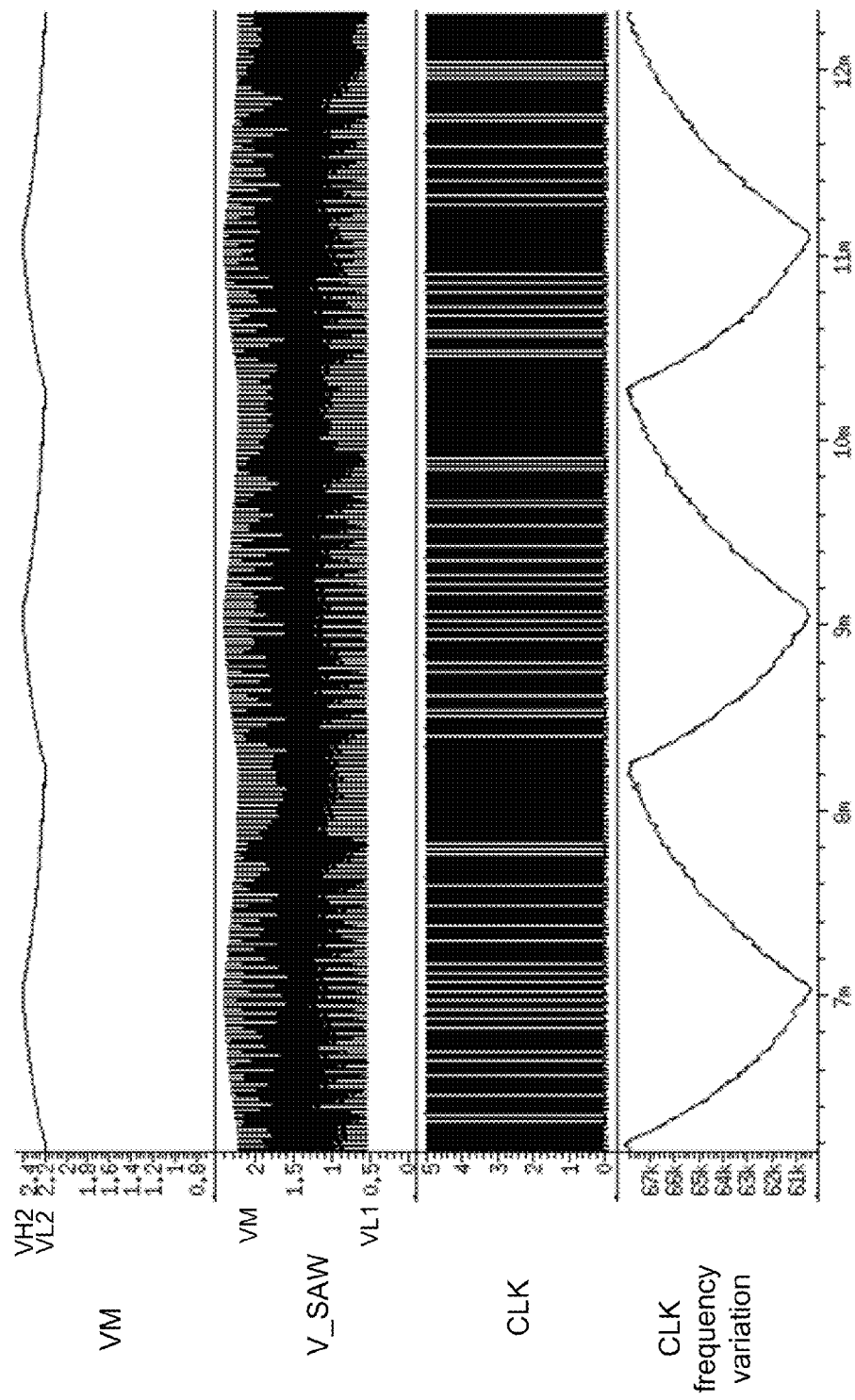
FIG. 6 shows waveforms of the frequency jitter operation for the switching control circuit with frequency jittering of FIG. 2 in accordance with one embodiment of the present invention.

FIG. 6 shows waveforms of the frequency jitter operation for the oscillator as shown in FIG. 3B, in accordance with one embodiment of the present invention. Voltage VM will preferably have a period of about two milliseconds and a magnitude varying between 2.2V (VL2) and 2.4V (VH2). Voltage V_SAW (at capacitor 318) will preferably vary between a low level of 0.5V (VL1) and a high level that corresponds to the waveform of voltage VM. In one embodiment of the present invention, clock CLK has a magnitude varying between 0V and 5V. In one embodiment, the frequency of CLK varies between 61 kHz and 68 kHz and the frequency variation corresponds to the period of voltage VM (i.e., 2 ms or 500 Hz). By spreading the frequency of CLK within a frequency range (e.g., 61 kHz to 68 kHz), the EMI energy is distributed accordingly across the frequency range, and therefore no peak energy of EMI will ever be present in the oscillator.

Figure 7:
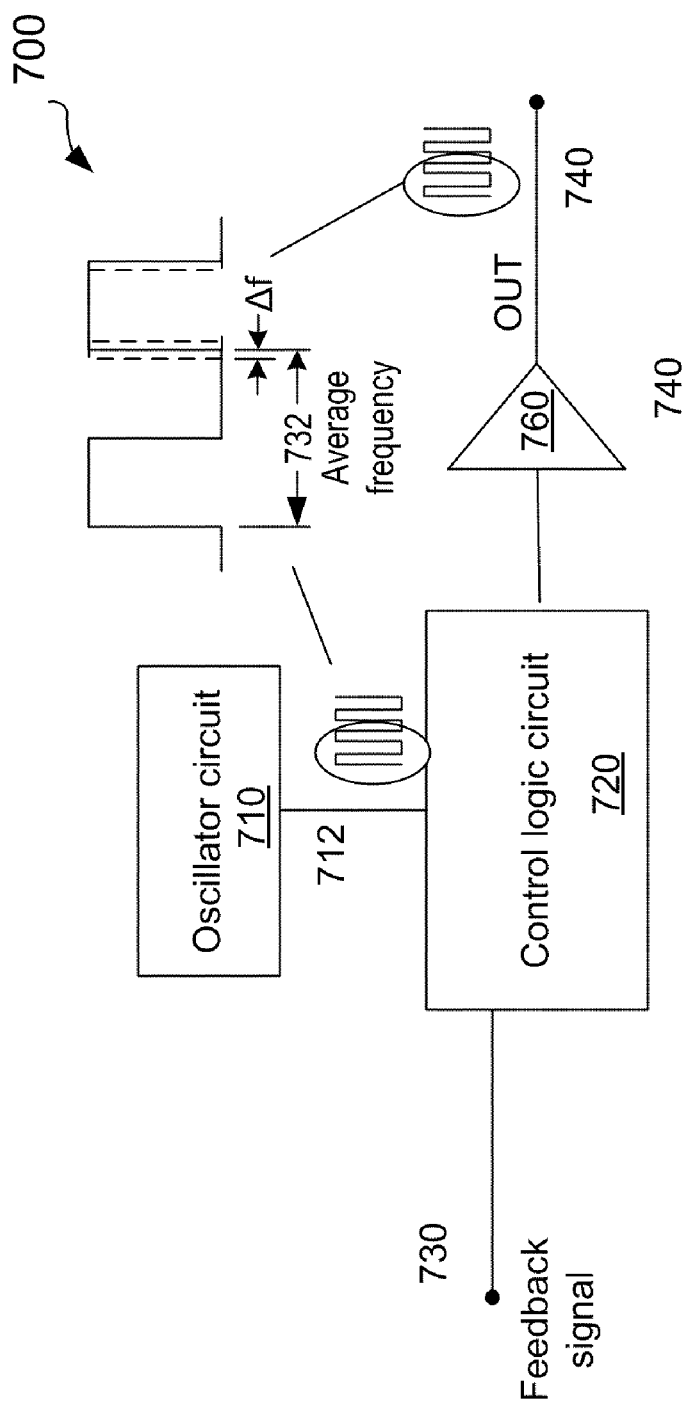
FIG. 7 is a block diagram of an SMPS controller having an oscillator with voltage controlled frequency jitter in accordance with one embodiment of the present invention.

FIG. 7 schematically shows a simplified block diagram of a switched mode power supply (SMPS) controller 700 according to one embodiment of the present invention. As shown, SMPS controller 700 includes an input terminal 730 for receiving a feedback signal from, e.g., a load of a power supply, an output terminal 740 for outputting a control signal OUT for controlling an output of the power supply. SMPS controller 700 also has a control logic circuit 720 that is configured to receive the feedback signal and provide the output control signal. Depending on the embodiment, control logic circuit 720 may use different method to produce the output control signal. In one example, control logic circuit 720 may produce a pulse width modulated (PWM) control signal. In another example, control logic 720 may produce a pulse frequency modulated (PFM) control signal. In one embodiment, feedback signal 722 may represent information about a regulated output voltage and/or current. Depending on the embodiment, feedback signal 722 may be obtained from sensing the regulated output voltage via an isolation device such as an auxiliary transformer winding or an opto-coupler.

Additionally, SMPS controller 700 also has an oscillator circuit 710 having an oscillator and a frequency jitter circuit having a charge pump. For example, oscillator circuit 710 may be implemented using oscillator circuit 300 depicted in FIGS. 1 and 2. The detailed structure and operation are described above. As shown in FIG. 7, oscillator circuit 710 provides a clock signal 712 to control logic circuit 720. The frequency jitter in clock signal 712 is depicted in the inserted clock waveform, which shows an average frequency related to clock period 732 and a time-varying frequency jitter Δf. The output signal OUT at output terminal 740 also exhibit frequency jitter, as shown in FIG. 7.

Figure 8:
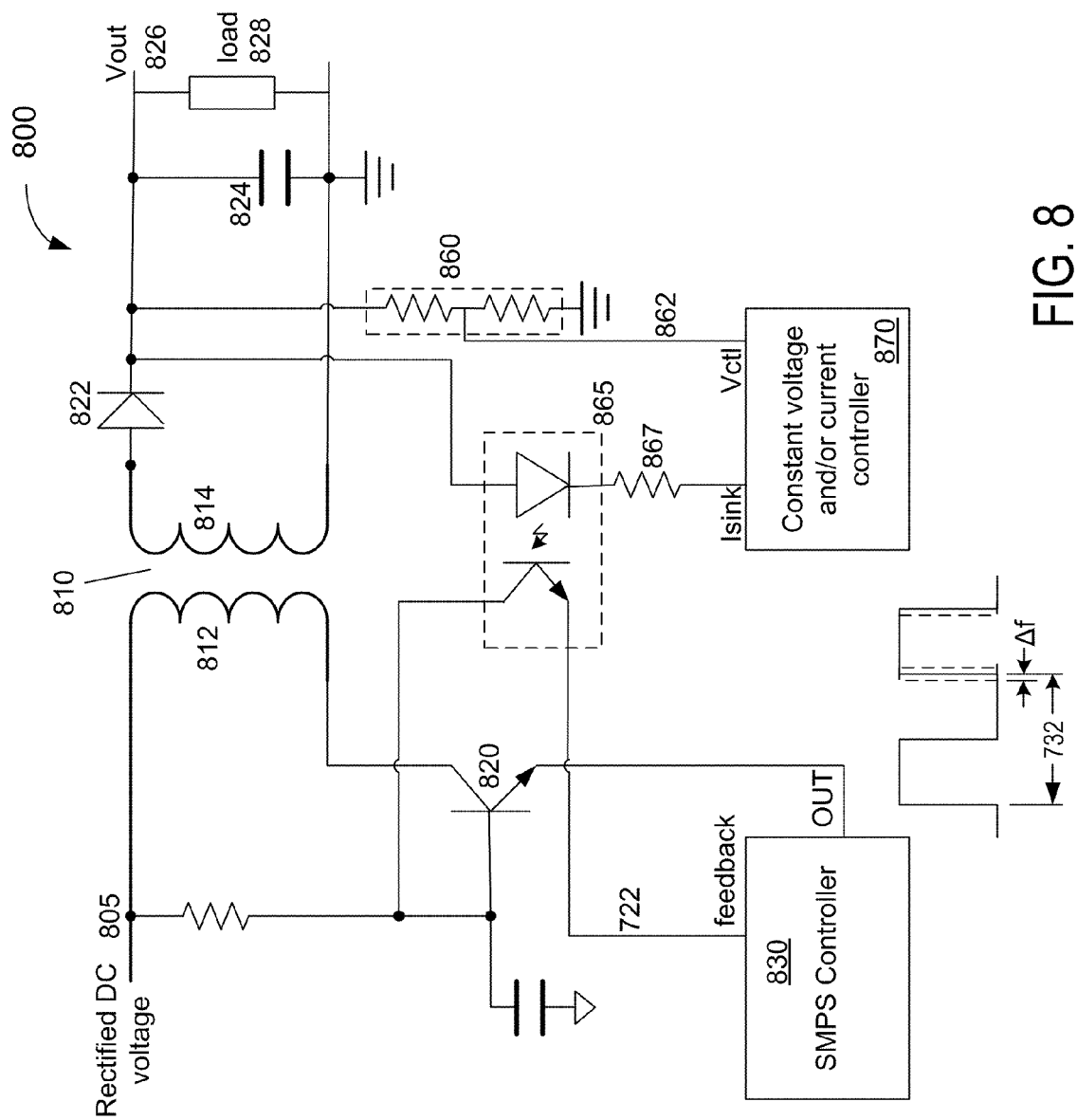
FIG. 8 is a block diagram of the power supply system including an SMPS controller in accordance with one embodiment of the present invention.

FIG. 8 shows a simplified schematic diagram of a switching mode power supply (SMPS) 800 according to an embodiment of the present invention. As shown, SMPS 800 has an SMPS controller 830, which may be similarly structured as the SMPS controller 700 of FIG. 7 in accordance with one embodiment of the present invention. In FIG. 8, a rectified dc voltage 805 supplies electric energy to a transformer 810 having a primary winding 812 and a secondary winding 814. The drive output Vout 826 of the power supply 800 is provided by secondary winding 814 and a rectifying circuit including a diode 822 and a capacitor 824, which smoothes Vout 826. In an embodiment, Vout 826 may drive a load 828. In this example, resistive divider 860 is coupled to Vout 826 to set the voltage regulation by dividing the desired output Vout 826 to obtain an attenuated voltage 862 for matching an internal voltage reference of a constant voltage controller 870. Attenuated voltage 862 is applied to input terminal Vctl of constant voltage controller 870, which compares attenuated 862 with the internal voltage reference to maintain a fixed desired Vout 826. Vout 826 is further coupled to a feedback circuit 865 configured to produce a feedback signal 722 as described in FIG. 7 to controller 830. In one embodiment, feedback circuit 865 is an opto-coupler having a photodiode coupled to an input terminal Isink of constant voltage controller 870 through a resistor 867. Feedback signal 722 contains thus voltage and current information of the secondary winding 814. In the exemplary embodiment shown in FIG. 8, output OUT of controller 830 is coupled to an emitter of transistor 820 to close the loop of the primary winding 812 using a clock having an average frequency 832, which may vary within a range Δf. In FIG. 8, output OUT of controller 830 is coupled to a base of a bipolar transistor to control power supply 800. In other embodiments, transistor 820 can be a high power MOSFET transistor. Depending on the embodiment, controller 830 may be a pulse width modulated (PWM) controller, a pulse frequency modulated (PFM) controller, or other kinds of controllers.

As described above, switching mode power supply 800 including controller 830 can reduce EMI radiation by spreading an average switching clock frequency 832 within a frequency range Δf. Furthermore, the time-varying magnitude of the oscillating voltage is generated by an oscillator circuit including a frequency jitter circuit, which utilizes a charge pump to transfer a charge to a reservoir capacitor. Detailed description of the frequency jitter circuit has been given in drawings and corresponding paragraphs above.

While the advantages and embodiments of the present invention have been depicted and described, there are many more possible embodiments, applications and advantages without deviating from the spirit of the inventive ideas described herein. It will be apparent to those skilled in the art that many modifications and variations in construction and widely differing embodiments and applications of the present invention will suggest themselves without departing from the spirit and scope of the invention.

Figure 9:
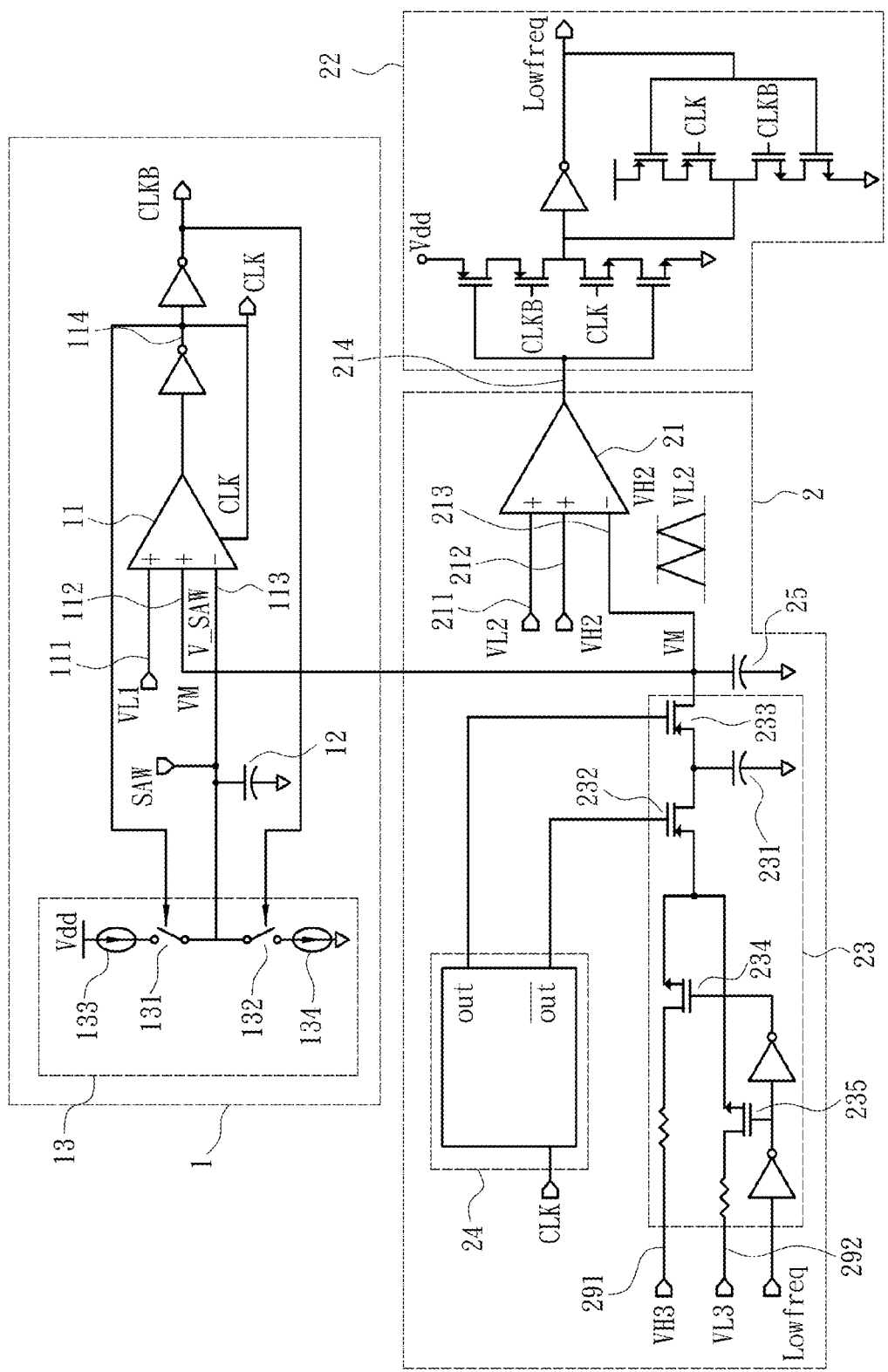
FIG. 9 is a schematic diagram of an alternative implementation of the oscillator circuit in FIGS. 1 and 2 in accordance with one embodiment of the present invention.

For example, FIG. 9 is a schematic diagram of an alternative implementation of the oscillator circuit in FIGS. 1 and 2 in accordance with one embodiment of the present invention. FIG. 9 illustrates a variation of the oscillator circuit of FIG. 2 with the non-overlapping clock generator 357 replaced with a clock generator block 24. Clock generator block 24 receives clock CLK and produces two complementary outputs OUT and OUT_bar for alternatively turning on switches 232 and 233. Switch 232 is interposed between a capacitor 231 and a high voltage VH3 291 and low voltage VL3 292. Voltage VH3 is coupled to switch 232 through a switch 234, and voltage VL3 is coupled to switch 232 through a switch 235. Depending on the logic state of Lowfreq, switch 232 either transfers charge from VH3 291 to capacitor 231 or transfers charge from capacitor 231 to VL3 292. Switch 233 transfers charge between capacitors 231 and 25.

Also in the example shown in FIG. 9, voltage V-SAW can be generated by charging and discharging a capacitor 12 via a current switched block 13. Block 13 includes a current source 133 coupled to capacitor 12 through a switch 131 and a current sink 134 coupled to capacitor 12 through a switch 132. Switches 133 and 132 are controlled by respective clock signals CLK and CLKB. In one embodiment, switches 132 and 133 can be implemented using PMOS transistors. When V-SAW is discharged below voltage VL1, comparator 11 outputs a high signal, CLK changes to logic low and turns on switch 131, and CLKB changes to logic high and turns off switch 132. Source current 133 charges capacitor 12 and causes voltage V-SAW to increase. Comparator 11 now compares voltage V_SAW with voltage VM. The output of comparator toggles again when voltage V_SAW exceeds the value of voltage VM. CLK is then logic high and CLKB is logic low. Capacitor 12 is discharged through switch 132 and sink current 134. And the cycle repeats.

Figure 10:
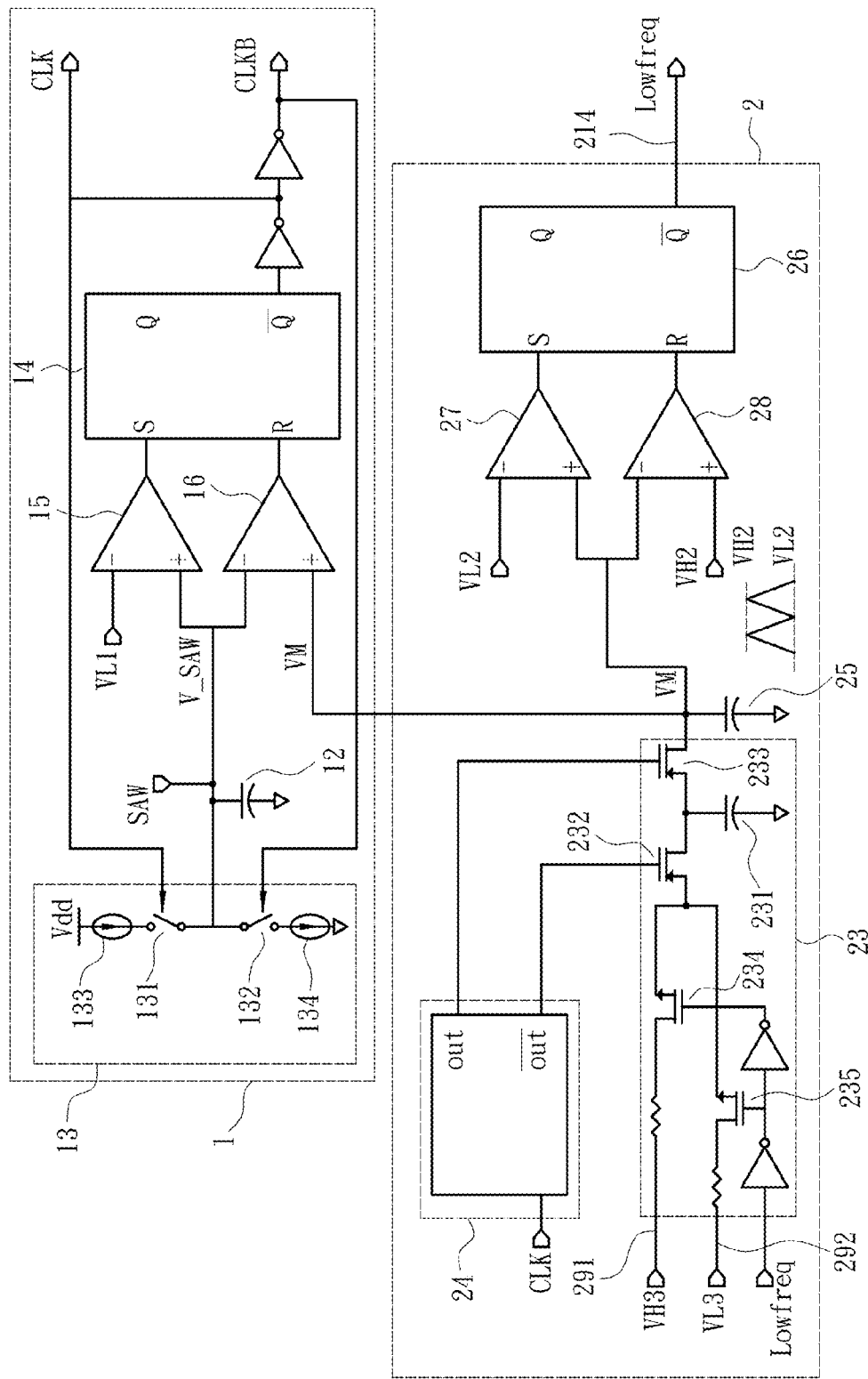
FIG. 10 is a schematic diagram of another implementation of the oscillator circuit in FIG. 9 in accordance with one embodiment of the present invention.

In another embodiment, each comparator 11 or 21 shown in FIG. 9 can be replaced with a pair of comparators and an RS flip-flop. As illustrated in FIG. 10, comparators 15 and 16 compare voltage V-SAW with respective voltages VL1 and VM, and the output of comparator 15 is coupled to the S input of RS flip-flop 14 and the output of the comparator 16 is coupled to the R input of RS flip-flop 14. Thus, comparators 15 and 16 and RS flipflop 14 together perform the equivalent function of comparator 11 shown in FIG. 9. Similarly, comparators 27 and 28 with output terminals coupled to the respective S and R inputs of RS flip-flop 26 perform the equivalent function of comparator 21 in FIG. 9. In the example shown in FIG. 10, Lowfreq signal 214 is not synchronized with CLK.

Figure 11:
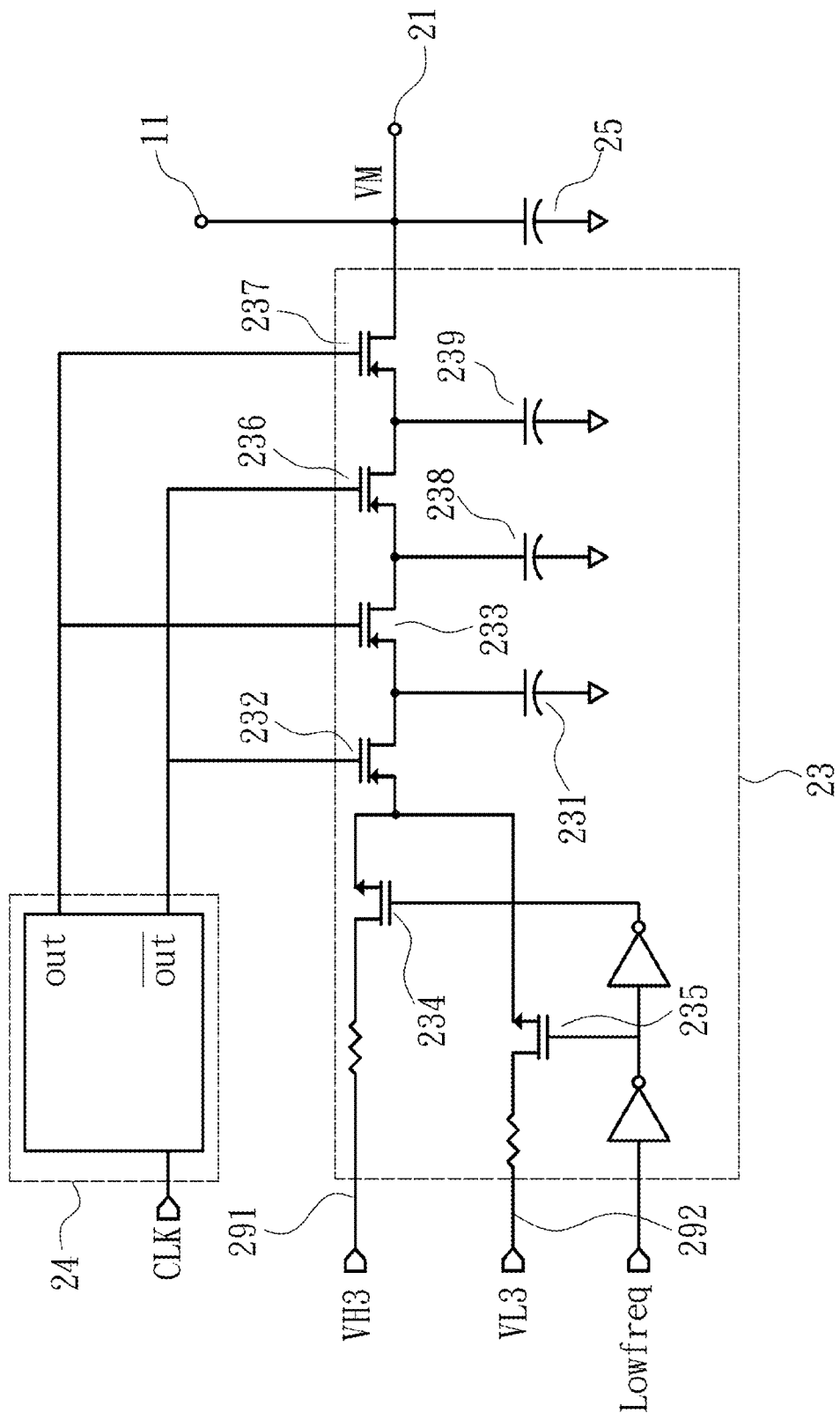
FIG. 11 is a schematic diagram of another implementation of charge pump circuit in FIG. 9 in accordance with one embodiment of the present invention.

In yet another embodiment, FIG. 11 illustrates another variation of charge pump circuit 23 in FIG. 9. In the example shown in FIG. 11, charge pump circuit 23 includes multiple capacitors 231, 238, and 239 and multiple switches 232, 233, 236, and 237. Switch 232 is interposed between capacitor 231 and VH3 291 and VL3 292. Depending on the logic state of Lowfreq signal, capacitor 231 is charged to VH3 or discharged to VL3 through switch 232. Switches 233, 238, and 239 are turned on in alternation to move the charge between capacitors 231 and 25 through intermediate capacitors 238 and 239.

Figure 12:
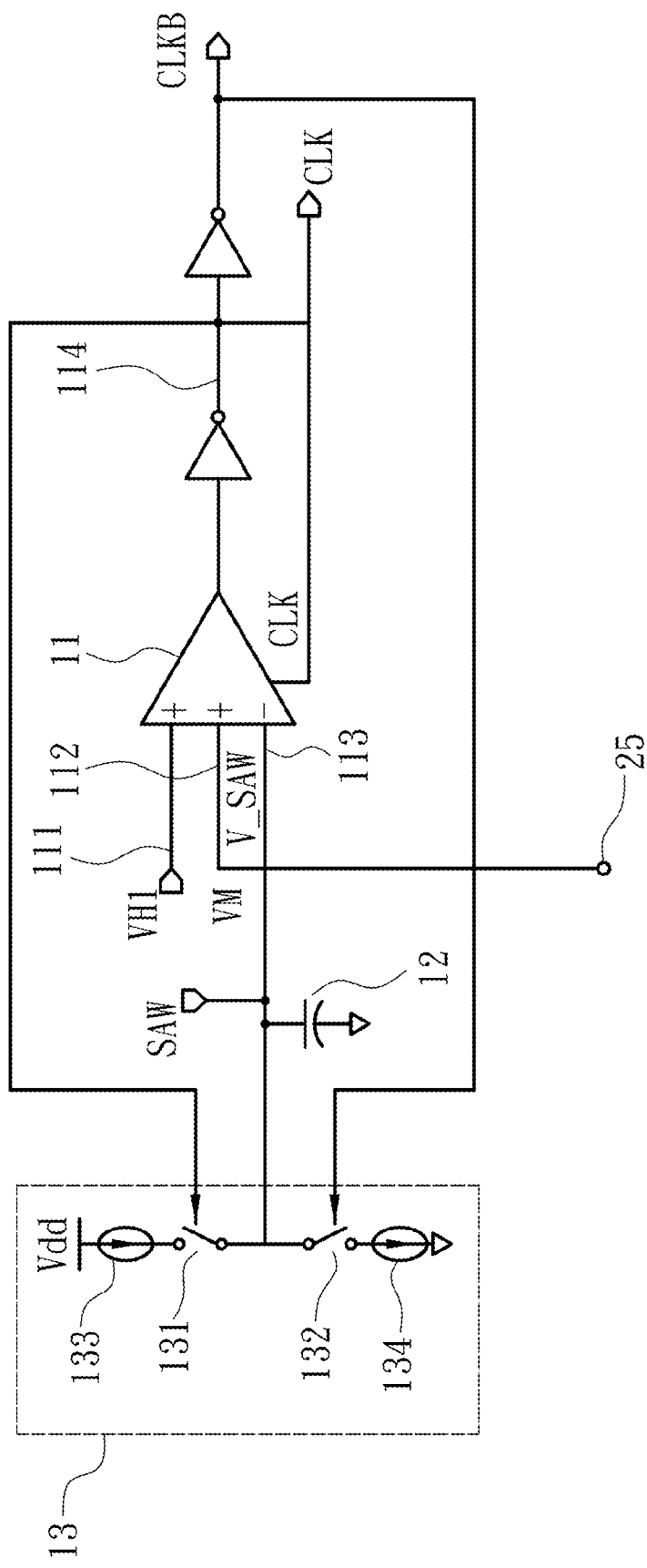
FIG. 12 illustrates an alternative implementation of the comparator circuit in FIG. 9 in accordance with one embodiment of the present invention.

FIG. 12 illustrates another variation of comparator 11 shown in FIG. 9. As shown, voltage VL1 at input 111 of comparator 11 may be replaced with a reference voltage VH1 that is higher than voltage VM. In this embodiment, voltage VH1 is held at a constant voltage level to ensure a constant high amplitude of voltage V_SAW, and voltage VM limits the lower amplitude voltage V_SAW.

The above description is illustrative and not restrictive. Many variations of the invention will become apparent to those skill in the art upon review of this disclosure. The scope of the invention should therefore be determined not with reference to the above description, but instead should be determined with reference to the appended claims along with their full scope of equivalents.

What is claimed is:

1. An oscillator circuit, comprising:
   an oscillator configured to generate a first clock having a first frequency; and
   a frequency jitter circuit including a charge pump having first and second capacitors, the charge pump being configured for transferring charges between the first and the second capacitors, the charge pump also configured to charge and discharge the first and the second capacitors repeatedly for providing a time-varying voltage having a second frequency that is lower than the first frequency;
   wherein the time-varying voltage is coupled to the oscillator to vary the first frequency within a frequency range.

2. The oscillator circuit of claim 1 wherein the charge pump comprises:
   a first switch for coupling the first capacitor to a voltage source;
   a second switch for coupling the first capacitor to the second capacitor; and
   a non-overlapping clock generator having an input terminal coupled to the first clock and being configured to produce a first phase clock and a second phase clock, the first and second phase clocks being non-overlapping signals;
   wherein the first phase clock is configured to turn on the first switch to transfer a first charge between the voltage source and the first capacitor, and the second phase clock is configured to turn on the second switch to transfer a second charge between the first capacitor and the second capacitor.

3. The oscillator circuit of claim 2 wherein the second charge is a function of the first frequency and a capacitance of the first capacitor.

4. The oscillator circuit of claim 1 wherein the frequency jitter circuit further comprises a first comparator configured to compare the time-varying voltage alternately with a low threshold voltage and with a high threshold voltage for obtaining a second clock having the second frequency.

5. The oscillator circuit of claim 4 wherein a direction of charge transfer between the first and second capacitors is related to an output of the first comparator.

6. The oscillator circuit of claim 4 wherein the low threshold voltage and the high threshold voltage determine the magnitude of the time-varying voltage.

7. The oscillator circuit of claim 6 wherein the magnitude of the time-varying voltage determines the frequency range of the first frequency.

8. The oscillator circuit of claim 1 wherein the frequency jitter circuit further comprises a clock synchronizer circuit configured to align the transition of the second clock with the first clock and produce a synchronized second clock having a low state and a high state, wherein the state of the synchronized second clock determines the direction of charge transfer between the first and second capacitors.

9. The oscillator circuit of claim 4 wherein the oscillator further comprises:
   a source current;
   a sink current;
   a source switch;
   a sink switch;
   a third capacitor, wherein the source current charges the third capacitor through the source switch; wherein the sink current discharges the third capacitor through the sink switch; and
   a second comparator configured to produce a switching signal for controlling the source and sink switches.

10. The oscillator circuit of claim 9 wherein the second comparator further comprises:
    a first input terminal coupled to a first threshold voltage;
    a second input terminal coupled to the time-varying voltage;
    a third input terminal coupled to a voltage of the third capacitor; and
    an output terminal configured to produce the switching signal;
    wherein the switching signal determines whether the voltage of the third capacitor is compared with the first threshold voltage or with the time-varying voltage.

11. A switched mode power supply (SMPS) controller, comprising:
    an input terminal for receiving a feedback signal from a load of a power supply;
    an output terminal for outputting a control signal for controlling an output of the power supply;
    an oscillator circuit having an oscillator and a frequency jitter circuit, the oscillator being configured to generate a first clock having a first frequency, the frequency jitter circuit including a charge pump having first and second capacitors, the charge pump being configured for transferring charges between the first and the second capacitors, the charge pump also configured to charge and discharge the first and the second capacitors repeatedly for obtaining a time-varying voltage having a second frequency, wherein the time-varying voltage is coupled to the oscillator to vary the first frequency within a frequency range; and a control logic circuit configured to provide the control signal based on a time-varying signal from the oscillator circuit and the feedback signal.

12. The controller of claim 11 wherein the charge pump in the oscillator circuit further comprises:
a first switch for coupling the first capacitor to a voltage source;
a second switch for coupling the first capacitor to the second capacitor; and
a non-overlapping clock generator having an input terminal coupled to the first clock and being configured to produce a first phase clock and a second phase clock, the first phase and second phase clocks being non-overlapping signals;
wherein the first phase clock is configured to turn on the first switch to transfer a first charge between the voltage source and the switched capacitor, and the second phase clock is configured to turn on the second switch to transfer a second charge between the first capacitor and the second capacitor.

13. The controller of claim 12, wherein the frequency jitter circuit further comprises a comparator configured to compare the time-varying voltage alternately with a low threshold voltage and with a high threshold voltage for obtaining a second clock having the second frequency.

14. The controller of claim 13 wherein a direction of charge transfer between the first and second capacitors is related to an output of the comparator.

15. The controller of claim 14 wherein the voltage source comprises:
a high reference voltage coupled to the first switch via a first voltage source switch; and
a low reference voltage coupled to the first switch via a second voltage source switch;
wherein the first and second voltage source switches are turned on and off with a synchronized low frequency clock.

16. The controller of claim 11 wherein the oscillator further comprises:
a source current;
a sink current;
a source switch;
a sink switch;
a third capacitor, wherein the source current charges the third capacitor through the source switch; wherein the sink current discharges the third capacitor through the sink switch; and
a second comparator configured to produce a switching signal for controlling the source and sink switches.

17. The controller of claim 16 wherein the second comparator further comprises:
a first input terminal coupled to a first threshold voltage;
a second input terminal coupled to the time-varying voltage;
a third input terminal coupled to a voltage of the third capacitor; and
an output terminal configured to produce the switching signal;
wherein the switching signal determines whether the voltage of the third capacitor is compared with the first threshold voltage or with the time-varying voltage.

18. The controller of claim 11 wherein the SMPS controller is a pulse width modulated (PWM) controller.

19. A power supply having a transformer with a primary winding coupled to a rectified dc voltage and a secondary winding for providing a regulated output, and a switched mode power supply (SMPS) controller, the SMPS controller comprising:
an input terminal for receiving a feedback signal from a load of a power supply;
an output terminal for outputting a control signal for controlling an output of the power supply;
an oscillator circuit having an oscillator and a frequency jitter circuit, the oscillator being configured to generate a first clock having a first frequency, the frequency jitter circuit including a charge pump having first and second capacitors, the charge pump being configured for transferring charges between the first and the second capacitors, the charge pump also configured to charge and discharge the first and the second capacitors repeatedly for obtaining a time-varying voltage having a second frequency, wherein the time-varying voltage is coupled to the oscillator to vary the first frequency within a frequency range; and
a control logic circuit configured to provide the control signal based on a time-varying signal from the oscillator circuit and the feedback signal.

20. The power supply of claim 19 wherein the charge pump further comprises:
a first switch for coupling the first capacitor to a voltage source;
a second switch for coupling the first capacitor to the second capacitor; and
a non-overlapping clock generator having an input terminal coupled to the first clock and being configured to produce a first phase clock and a second phase clock, the first and second phase clocks being non-overlapping signals;
wherein the first phase clock is configured to turn on the first switch to transfer a first charge between the voltage source and the first capacitor, and the second phase clock is configured to turn on the second switch to transfer a second charge between the first capacitor and the second capacitor.

21. The power supply of claim 19 wherein the oscillator further comprises a comparator having:
a first input terminal coupled to a first threshold voltage;
a second input terminal coupled to the time-varying voltage;
a third input terminal coupled to a voltage of the third capacitor; and
an output terminal configured to produce the switching signal;
wherein the switching signal determines whether the voltage of the third capacitor is compared with the first threshold voltage or with the time-varying voltage.

22. The power supply of claim 19 wherein the SMPS controller is a pulse width modulated (PWM) controller.

23. A method of generating a clock signal, the method comprising:
providing an oscillator circuit including a first comparator configured to produce the clock signal having a first frequency varying within a frequency range;
providing a frequency jitter circuit including a charge pump having first and second capacitors, the charge pump being configured for transferring charges between the first and the second capacitors, the charge pump also configured to charge and discharge the first and the second capacitors for producing a time-varying voltage; and applying the time-varying voltage to the first comparator to vary the first frequency within the frequency range.

24. The method of claim 23 wherein the charge pump further comprises:
- a first switch for coupling the first capacitor to a voltage source;
- a second switch for coupling the first capacitor to the second capacitor; and
- a clock generator having an input terminal coupled to the first clock and configured to produce a first phase clock and a second phase clock, the first phase and second phase clocks being non-overlapping signals;

wherein the first phase clock is configured to turn on the first switch to transfer a first charge between the voltage source and the first capacitor, and the second phase clock is configured to turn on the second switch to transfer a second charge between the first and the second capacitors.

25. The method of claim 24 wherein the frequency jitter circuit further comprises a second comparator configured to compare the time-varying voltage alternately with a low threshold voltage and with a high threshold voltage for obtaining a second clock having a second frequency, wherein a direction of charge transfer between the first and second capacitors is related to an output of the second comparator.

* * * * *